(12) United States Patent
Chen et al.

(10) Patent No.: US 10,694,847 B2
(45) Date of Patent: Jun. 30, 2020

(54) SLIDE RAIL MECHANISM AND BRACKET DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/186,589

(22) Filed: Nov. 12, 2018

(65) Prior Publication Data

US 2020/0022493 A1  Jan. 23, 2020

(30) Foreign Application Priority Data

Jul. 19, 2018  (TW) .............................. 107125283 A

(51) Int. Cl.
  *A47B 88/43*  (2017.01)
  *A47B 88/49*  (2017.01)
  *A47B 88/407*  (2017.01)

(52) U.S. Cl.
  CPC ............ *A47B 88/43* (2017.01); *A47B 88/407* (2017.01); *A47B 88/49* (2017.01)

(58) Field of Classification Search
  CPC ....... A47B 88/43; A47B 88/49; A47B 88/407; A47B 88/44; A47B 88/443; A47B 88/447; A47B 88/423; H05K 7/1421
  USPC ...................................... 248/219.3
  See application file for complete search history.

(56) References Cited

U.S. PATENT DOCUMENTS

| 8,585,166 B2* | 11/2013 | Chen .................... A47B 88/493 312/333 |
|---|---|---|
| 9,144,173 B2 | 9/2015 | Chen |
| 9,258,923 B2 | 2/2016 | Chen |
| 9,328,769 B1* | 5/2016 | Chen .................... H05K 7/1489 |
| 10,213,017 B2 | 2/2019 | Chen |
| 2014/0217049 A1* | 8/2014 | Chen .................... H05K 7/1489 211/195 |

(Continued)

FOREIGN PATENT DOCUMENTS

| EP | 2 989 930 A1 | 3/2016 |
|---|---|---|
| EP | 3 307 037 A1 | 4/2018 |
| EP | 3 324 714 A1 | 5/2018 |

(Continued)

*Primary Examiner* — Christopher Garft
(74) *Attorney, Agent, or Firm* — Winston Hsu

(57) ABSTRACT

A bracket device adapted to a slide rail mechanism is disclosed. The bracket device includes a first supporting frame, a second supporting frame and a bracket. The second supporting frame is movable relative to the first supporting frame. The bracket includes a side wall and at least one mounting member arranged adjacent to the side wall. Herein, the first supporting frame and the second supporting frame are able to be engaged with each other through a first structure and a second structure, in order to be moved simultaneously from a first position along a direction.

10 Claims, 10 Drawing Sheets

(56) References Cited

U.S. PATENT DOCUMENTS

2017/0095078 A1    4/2017   Chen
2018/0168349 A1    6/2018   Chen

FOREIGN PATENT DOCUMENTS

| JP | 2017-72242 A | 4/2017 |
| JP | 2018-57812 A | 4/2018 |

* cited by examiner

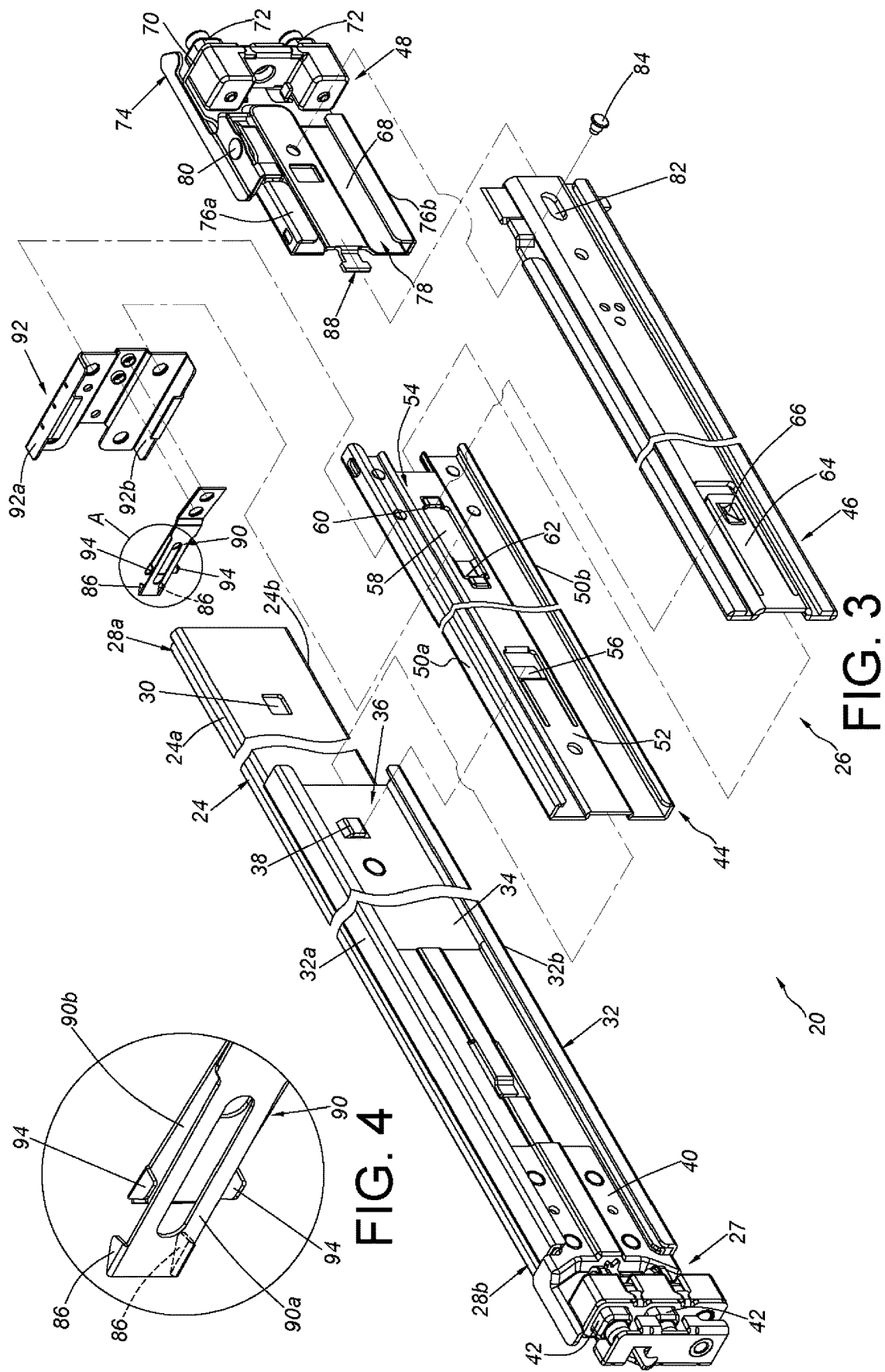

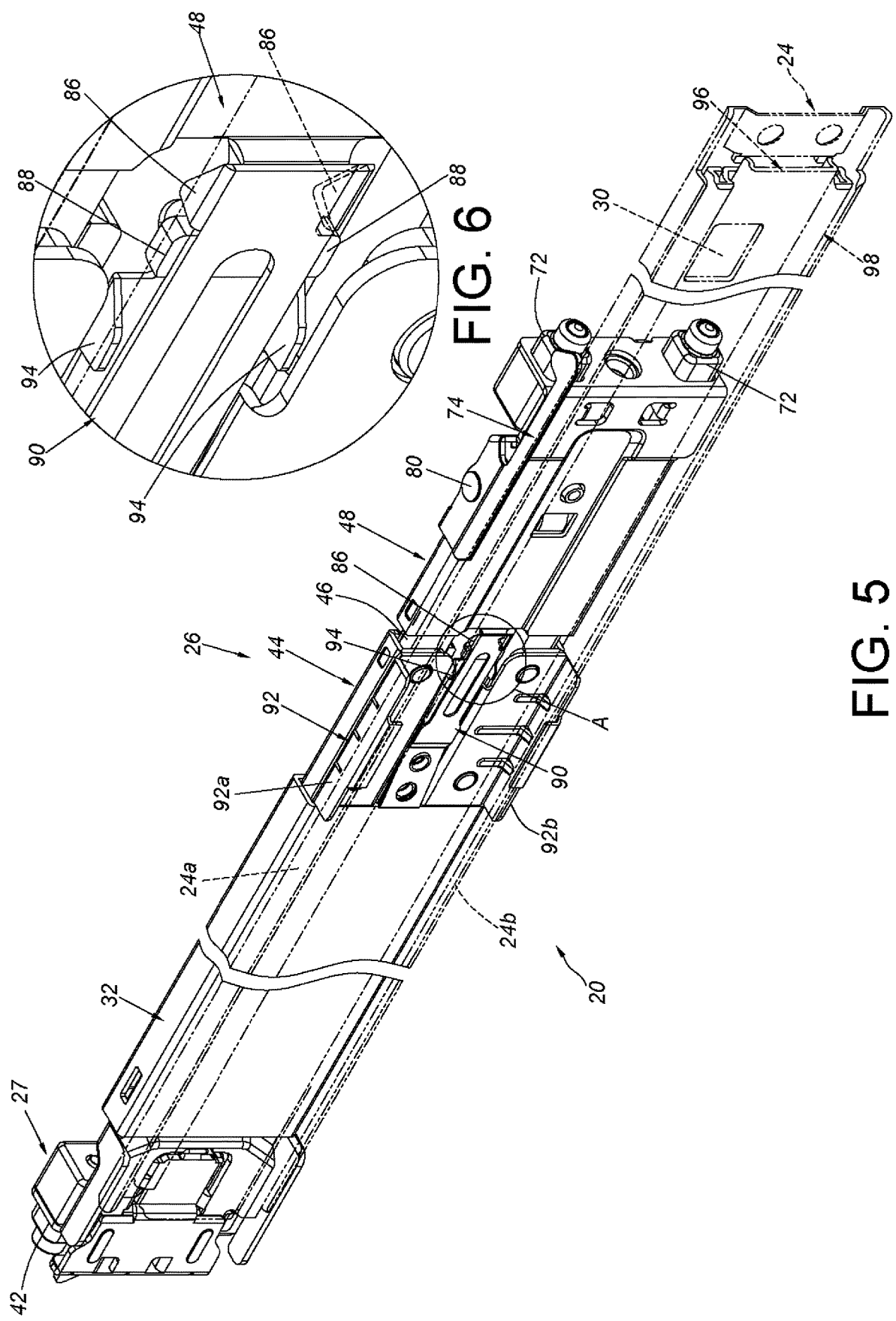

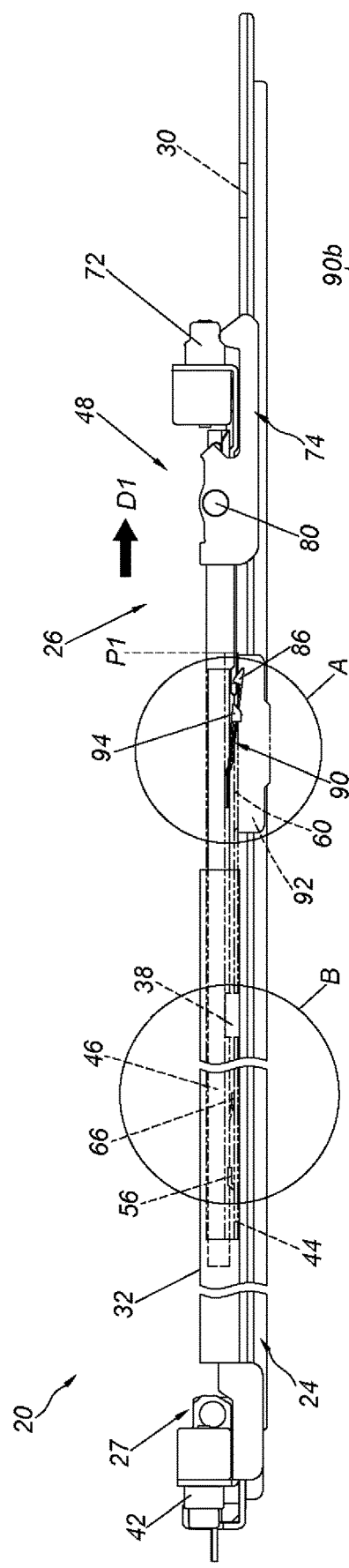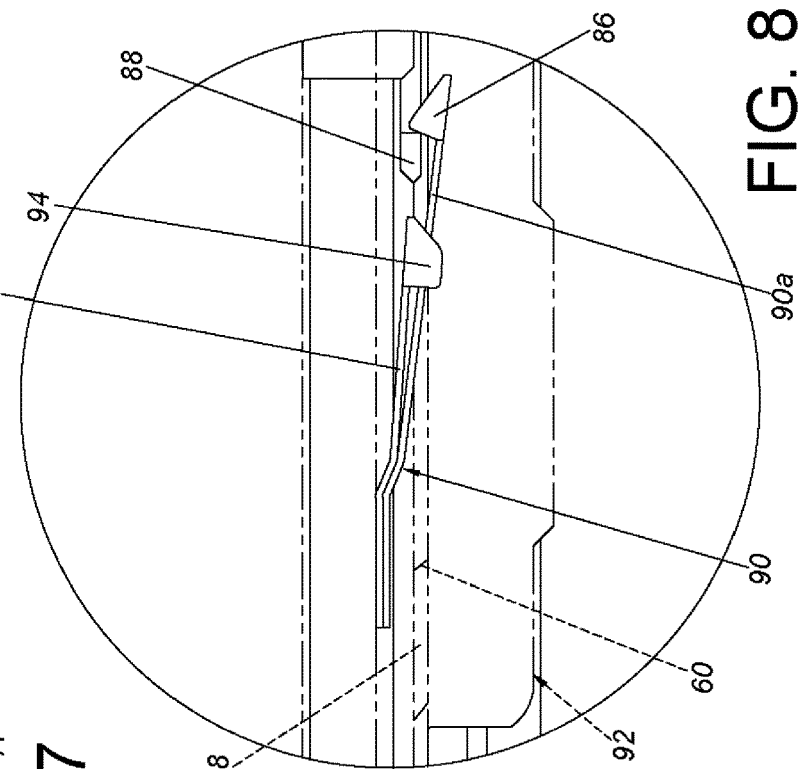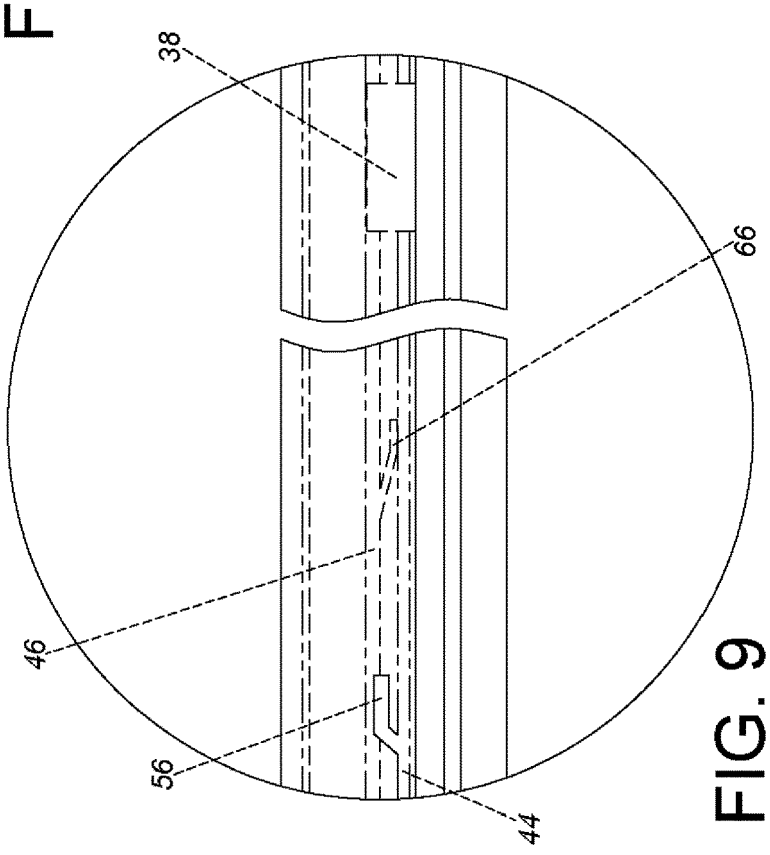

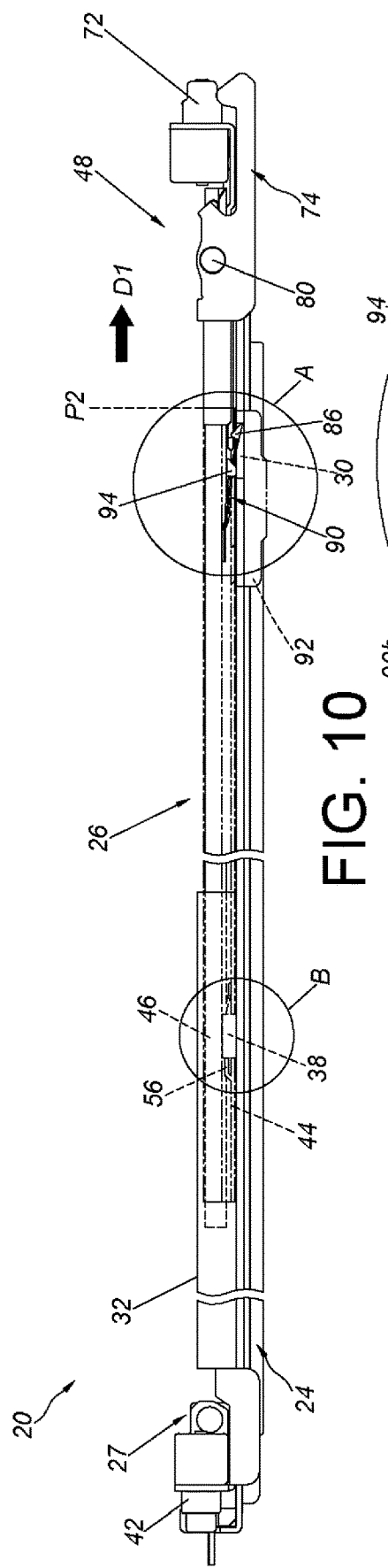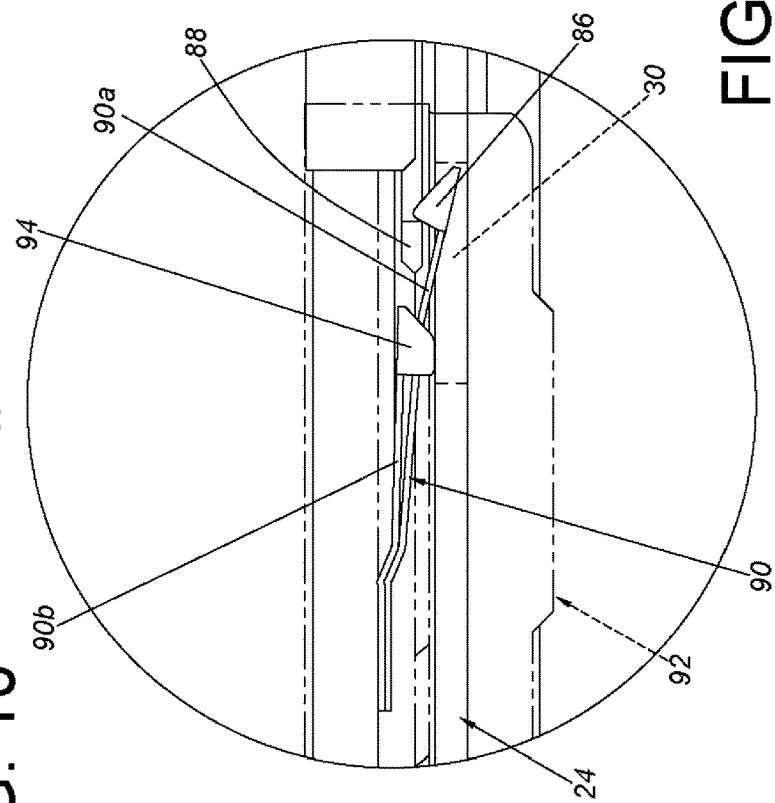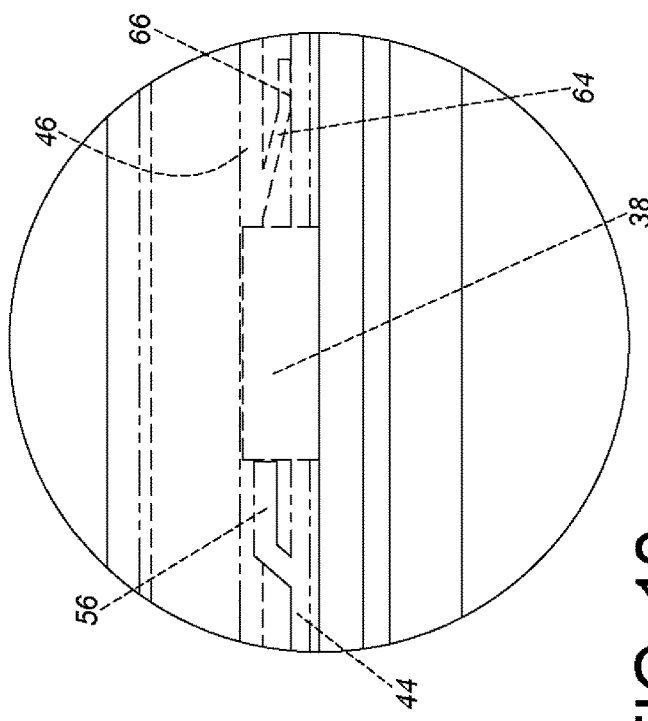

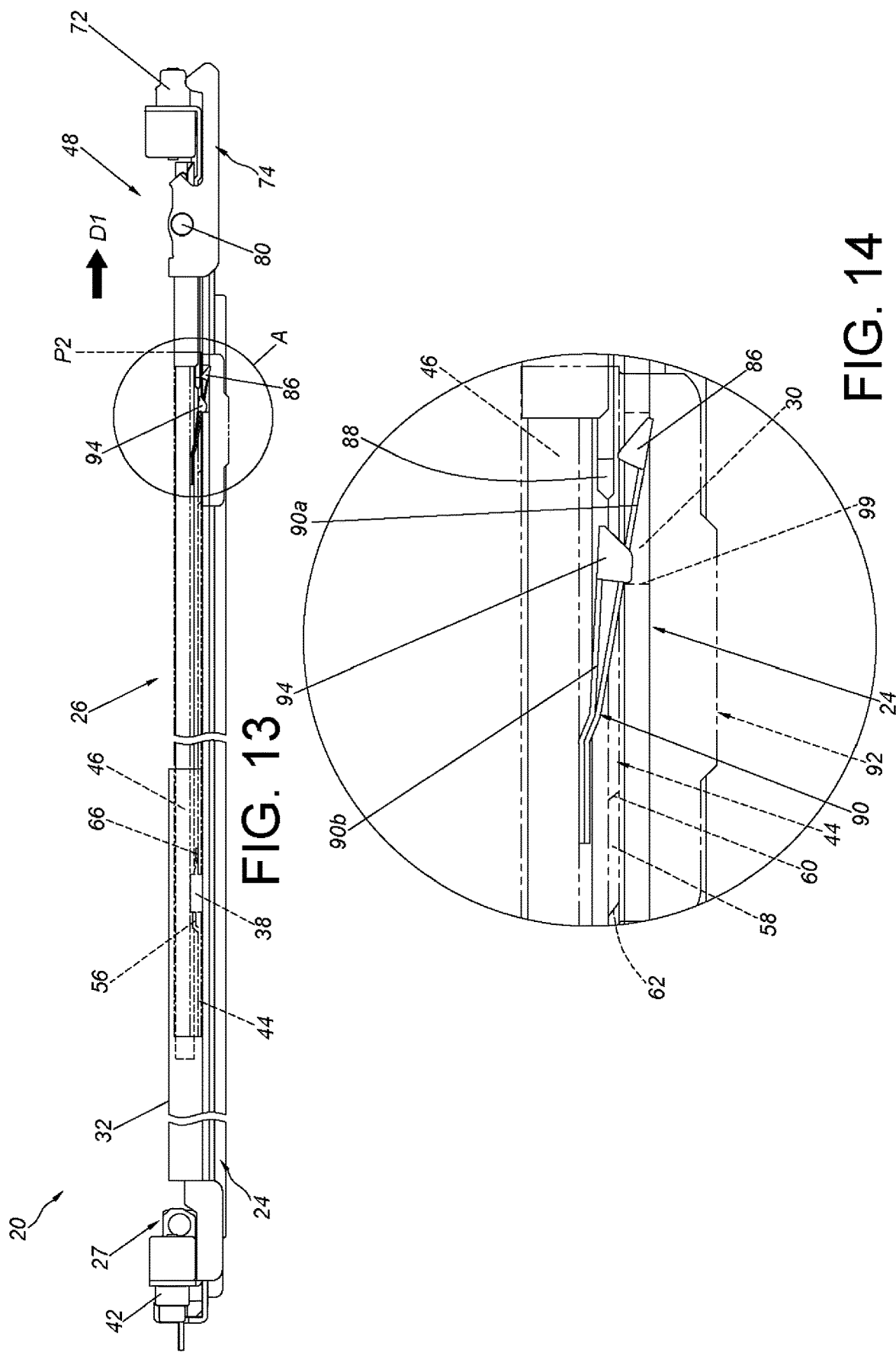

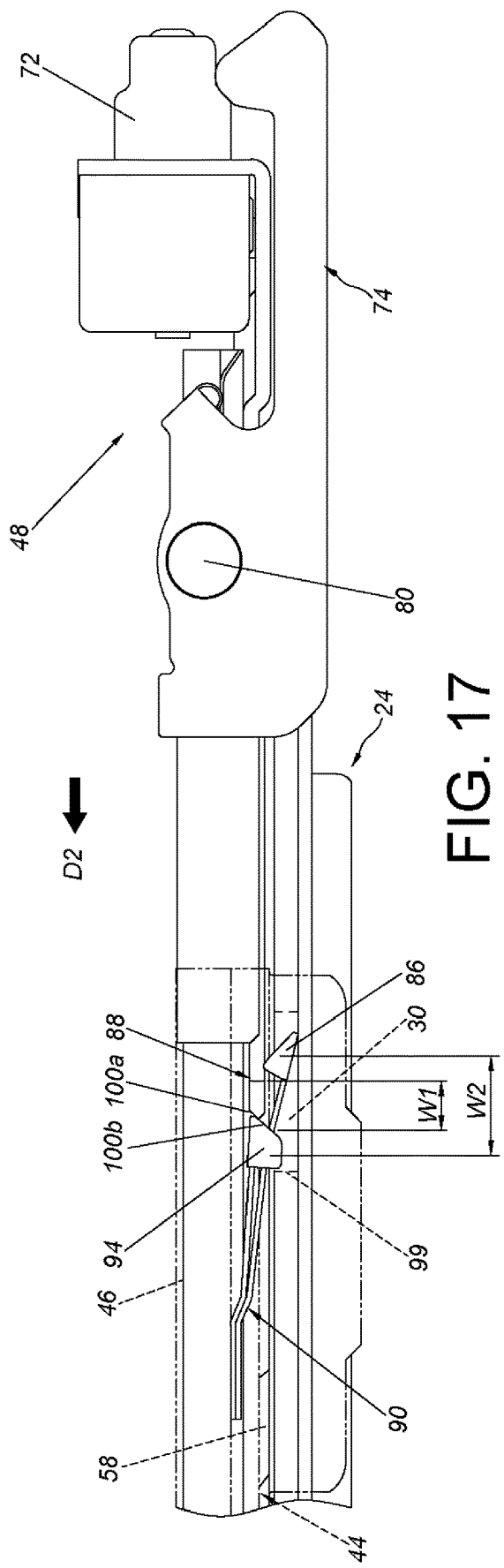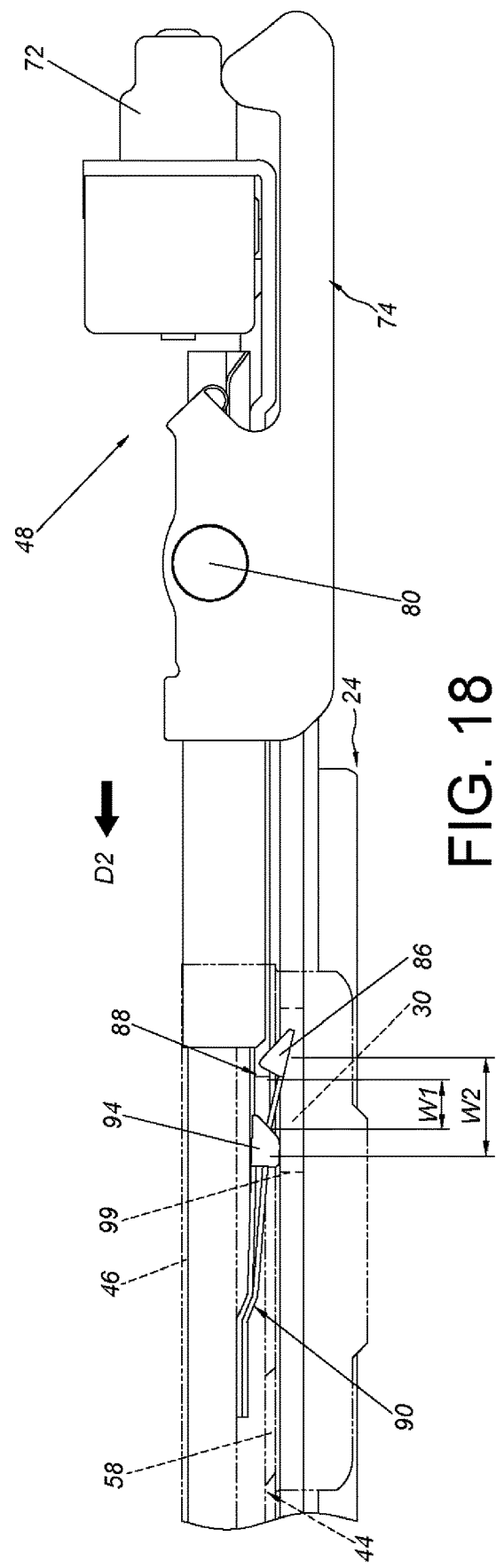

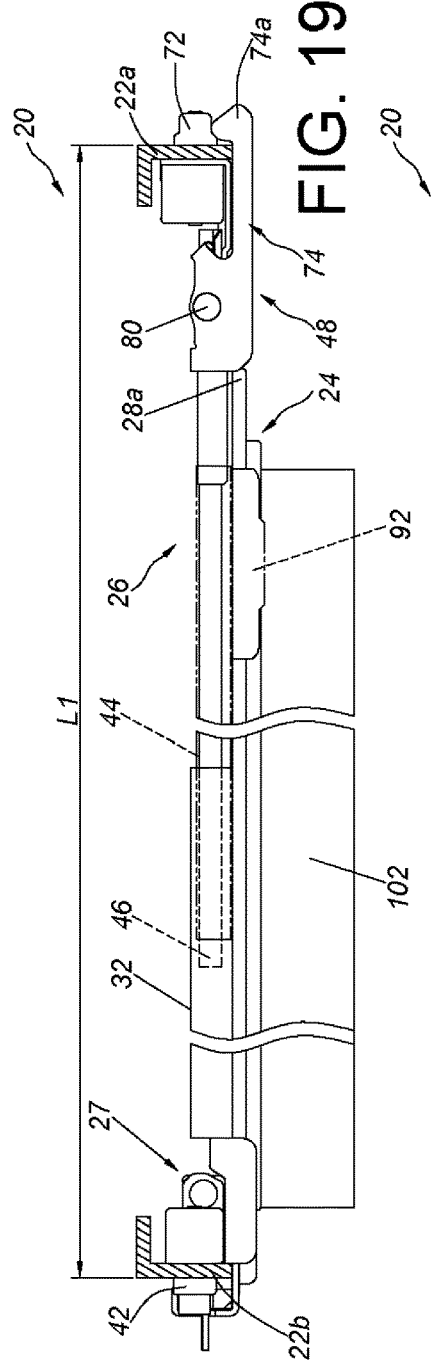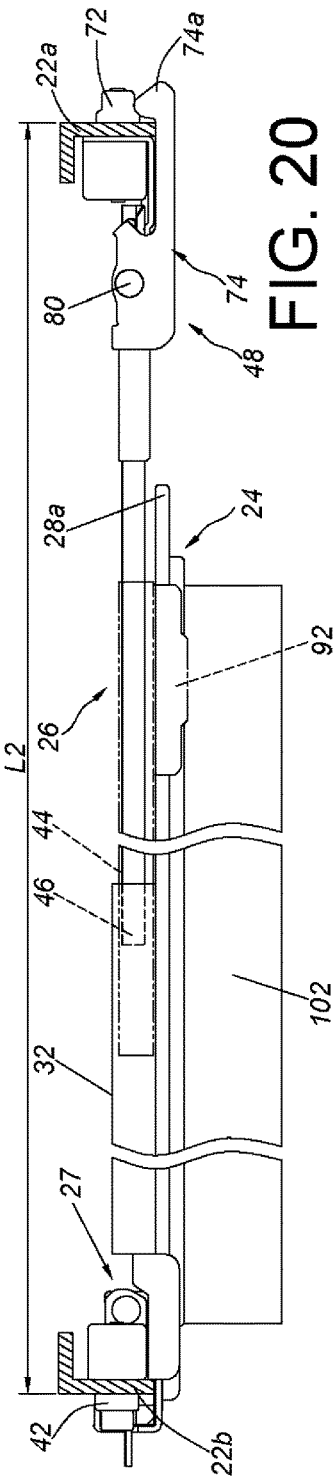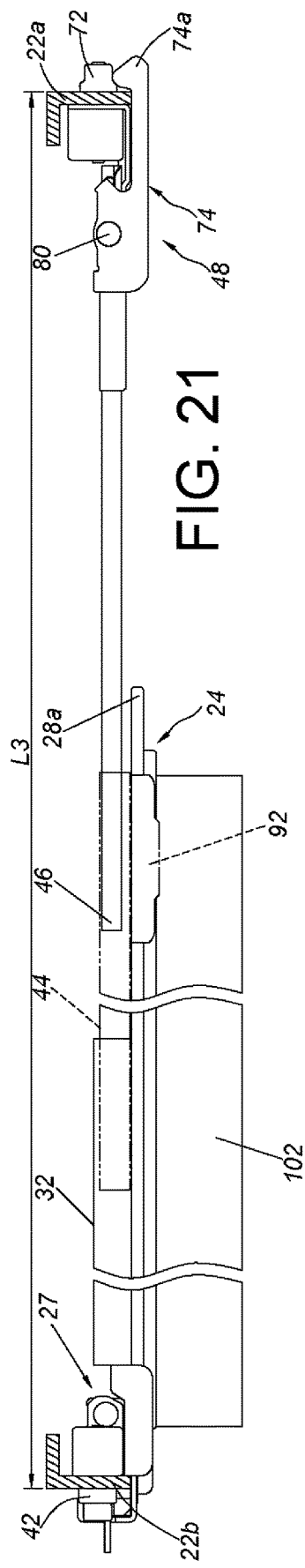

SLIDE RAIL MECHANISM AND BRACKET DEVICE THEREOF

BACKGROUND OF THE INVENTION

1. Field of the Invention

The present invention relates to a bracket device, and more particularly, to a bracket device applicable to a slide rail mechanism.

2. Description of the Prior Art

U.S. Pat. No. 9,328,769 B1 discloses a slide rail assembly and a bracket device. As shown in FIG. 2 of the US patent, the bracket device (24) is arranged on a side of the slide rail (22). The bracket device (24) comprises a first supporting frame (32), a second supporting frame (34), a third supporting frame (36) and a mounting bracket (38). The mounting bracket (38) is movably mounted on the third supporting frame (36), and the mounting bracket (38) is able to be mounted on a post (98a) of a rack through a mounting member (58). The second supporting frame (34) is movable relative to the first supporting frame (32), and the third supporting frame (36) is movable relative to the second supporting frame (34). According to the above arrangement, the bracket device (24) is able to be adjusted to form different lengths for fitting different depths of racks.

However, there is no specific structural relationship between the second supporting frame (34) and the third supporting frame (36). Therefore, the second supporting frame (34) is not able to be driven to be moved by the third supporting frame (36) to a predetermined position, such that the related products are not able to meet the requirements of the market.

SUMMARY OF THE INVENTION

The present invention relates to a bracket device applicable to a slide rail mechanism.

According to an aspect of the present invention, a slide rail mechanism includes a rail member and a first bracket device. The first bracket device is arranged on the rail member. The first bracket device comprises a first supporting frame, a second supporting frame and a bracket. The first supporting frame is movable relative to the rail member. The second supporting frame is movable relative to the first supporting frame. The bracket arranged on the second supporting frame. Wherein, the first supporting frame and the second supporting frame are able to be engaged with each other through a first structure and a second structure, in order to be moved simultaneously from a first position along a direction. Wherein, the bracket is configured to mount the rail member on the rack.

Preferably, when the first supporting frame and the second supporting frame are further moved simultaneously along the direction to a second position, the first structure and the second structure are disengaged through a function feature.

Preferably, the rail member comprises the function feature.

Preferably, the first bracket device comprises an elastic member, the first structure is arranged on the elastic member, when the first supporting frame and the second supporting frame are located at the second position, the elastic member is deflected by an angle and disengages the first structure from the second structure, such that the first supporting frame and the second supporting frame are not moved simultaneously.

Preferably, the elastic member is attached on the first supporting frame, the second structure is arranged on one of the second supporting frame and the bracket.

Preferably, the elastic member is connected to the first supporting frame through a reinforcing member.

Preferably, the reinforcing member comprises at least one supporting portion supporting the rail member.

Preferably, the function feature comprises a wall, when the first supporting member is located at the second position, the elastic member is deflected by the angle and engaged with the wall of the function feature of the rail member through an engaging portion, in order to prevent the first supporting frame from moving along an opposite direction of the direction.

Preferably, the rail member comprises a limiting feature, which corresponds to another limiting feature of the first supporting frame, and is configured to prevent the first supporting frame from being moved from the second position along the direction.

Preferably, the second supporting frame is movable relative to the first supporting frame along the direction to a third position, the first supporting frame comprises an abutting feature, which corresponds to another abutting feature of the second supporting frame, and is configured to prevent the second supporting frame from being moved from the third position along the direction.

Preferably, the bracket comprises a side wall and at least one mounting member arranged adjacent to the side wall, the at least one mounting member is configured to being mounted on the rack.

Preferably, the slide rail mechanism further comprises a fastening member configured to lock the rack.

Preferably, the first bracket device is arranged on a first side of the rail member.

Preferably, the slide rail mechanism further comprises another rail member movably mounted on a second side of the rail member, the first side and the second side of the rail member are two opposite sides.

Preferably, the first bracket device is attached on and adjacent to a first end portion of the rail member, the slide rail mechanism further comprises a second bracket device attached on and adjacent to a second end portion of the rail member.

According to another aspect of the present invention, a bracket device includes a first supporting frame, a second supporting frame and a bracket. The second supporting frame is movable relative to the first supporting frame. The bracket is arranged on the second supporting frame. The bracket comprises a side wall and at least one mounting member arranged adjacent to the side wall. Wherein, the first supporting frame and the second supporting frame are able to be engaged with each other through a first structure and a second structure, in order to be moved simultaneously from a first position along a direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is an exploded view of the slide rail mechanism.

FIG. 4 is an enlarged view of an area A of FIG. 3.

FIG. 5 is a schematic diagram illustrating the slide rail mechanism in another point of view according to the embodiment of the present invention.

FIG. 6 is an enlarged view of an area A of FIG. 5.

FIG. 7 is a diagram illustrating a bracket device of the slide rail mechanism being retracted status according to the embodiment of the present invention.

FIG. 8 is an enlarged view of an area A of FIG. 7.

FIG. 9 is an enlarged view of an area B of FIG. 7.

FIG. 10 is a diagram illustrating a first supporting frame and a second supporting frame of the bracket device of the slide rail mechanism are moved simultaneously along a direction to a position, and a first structure being engaged with a second structure according to the embodiment of the present invention.

FIG. 11 is an enlarge view of an area A of FIG. 10.

FIG. 12 is an enlarge view of an area B of FIG. 10.

FIG. 13 is a diagram illustrating the first supporting frame and the second supporting frame of the bracket device of the slide rail mechanism being located at the position, and the first structure being disengaged from the second structure according to the embodiment of the present invention.

FIG. 14 is an enlarge view of an area A of FIG. 13.

FIG. 17 is a diagram illustrating the second supporting frame of the bracket device of the slide rail mechanism is driven to be retracted relative to the first supporting from the other position along another direction according to the embodiment of the present invention.

FIG. 18 is a diagram illustrating the second supporting frame of the bracket device of the slide rail mechanism is further driven to be retracted relative to the first supporting from the other position along the other direction according to the embodiment of the present invention.

FIG. 19 is a diagram illustrating the bracket device having a first length, such that the slide rail mechanism is able to be mounted on a rack having a first depth according to the embodiment of the present invention.

FIG. 20 is a diagram illustrating the bracket device having a second length, such that the slide rail mechanism is able to be mounted on a rack having a second depth according to the embodiment of the present invention.

FIG. 21 is a diagram illustrating the bracket device having a third length, such that the slide rail mechanism is able to be mounted on a rack having a third depth according to the embodiment of the present invention.

DETAILED DESCRIPTION

Figure 1:
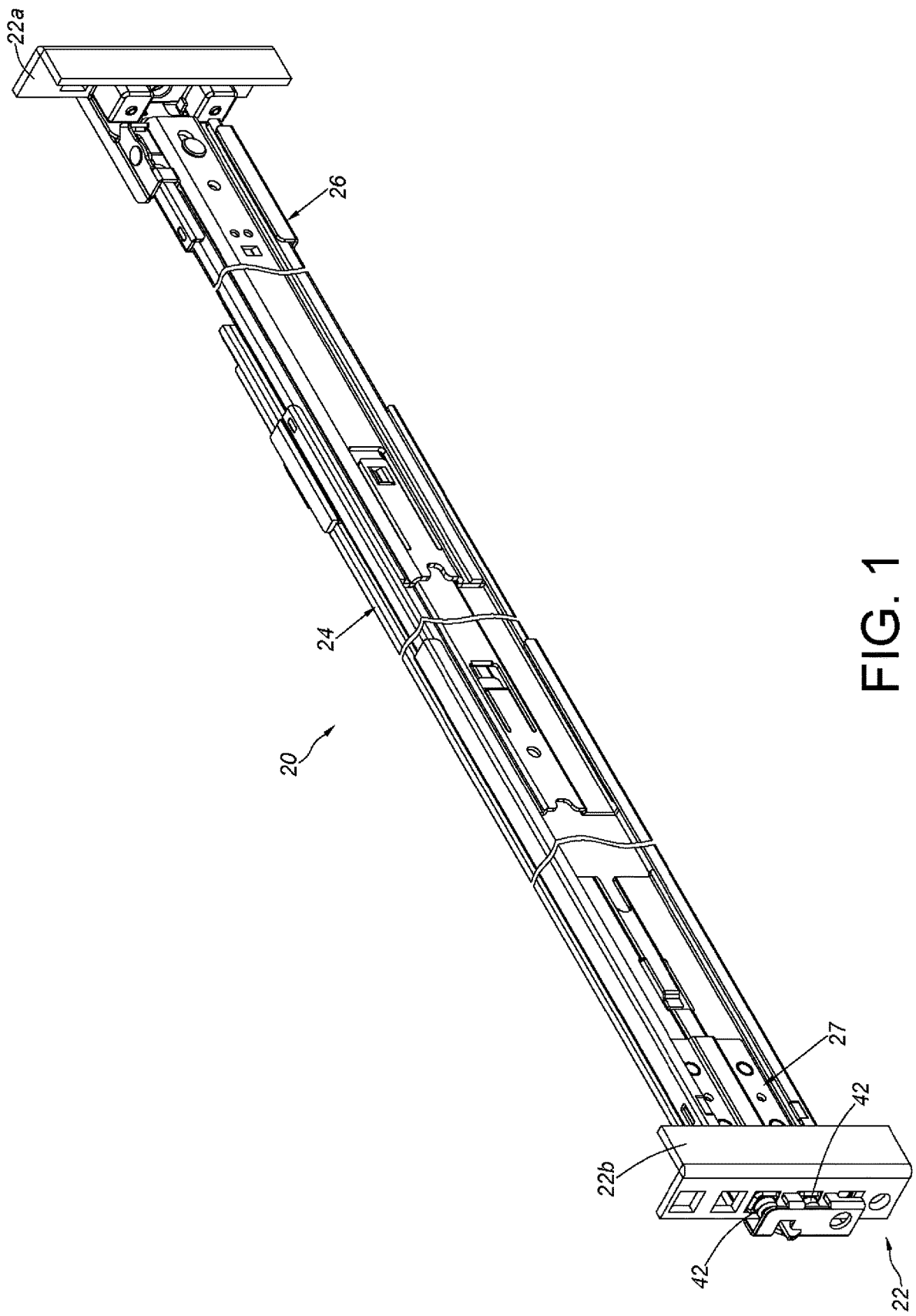
FIG. 1 is a schematic diagram illustrating a slide rail mechanism mounted on a rack according to an embodiment of the present invention.

As shown in FIG. 1, a slide rail mechanism 20 of an embodiment of the present invention is applicable to a rack 22. The slide rail mechanism 20 includes a rail member 24 (also known as a first rail), and is able to be mounted on a first post 22a and a second post 22b of the rack 22 through a first bracket device 26 (also known as a bracket device) and a second bracket device 27.

Figure 2:
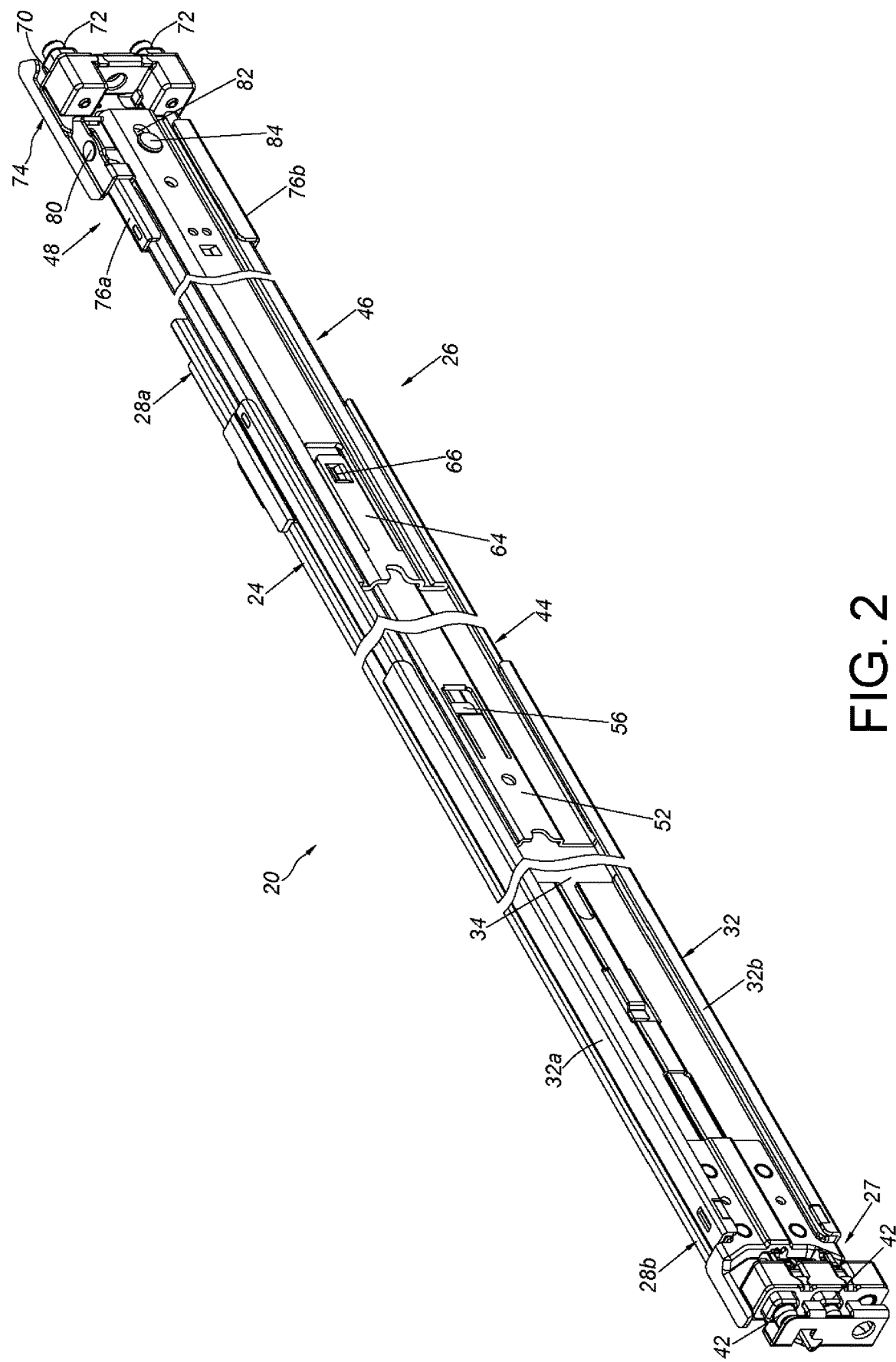
FIG. 2 is a schematic diagram illustrating the slide rail mechanism.

As shown in FIG. 2 and FIG. 3, the rail member 24 has a first end portion 28a and a second end portion 28b located relative to the first end portion 28a. In the present embodiment, the first end portion 28a and the second end portion 28b are a rear end portion and a front end portion respectively, but the present invention is not limited thereto. Preferably, the rail member 24 includes a function feature 30 located between the first end portion 28a and the second end portion 28b. Preferably, the function feature 30 is close to the first end portion 28a. In the present embodiment, the function feature 30 is a hole, a slot or a recessed portion, but the present invention is not limited thereto. Preferably, the slide rail mechanism 20 further includes a supporting rail 32 connected to (such as fixedly connected to) a first side of the rail member 24 (e.g., a back side of the rail member 24). The supporting rail 32 is able to be regarded as a part of the rail member 24. The supporting rail 32 is connected to the rail member 24 by riveting or welding. Furthermore, the supporting rail 32 has an upper wall 32a, a lower wall 32b and a longitudinal wall 34 connected between the upper wall 32a and the lower wall 32b. A passage 36 is defined by the upper wall 32a, the lower wall 32b and the longitudinal wall 34. Preferably, the longitudinal wall 34 of the supporting rail 32 of the rail member 24 includes a first limiting feature 38 located in the passage 36. Hereinafter, it is illustrative of an example that the first limiting feature 38 is a protrusion.

The second bracket device 27 is attached on and adjacent to the second end portion 28b of the rail member 24. Preferably, the second bracket device 27 has a side wall 40 and at least one mounting member 42 arranged adjacent to an end of the side wall 40. The side wall 40 is connected to the longitudinal wall 34 of the supporting rail 32. In the present embodiment, the quantity of the at least one mounting member 42 is two, but the present invention is not limited thereto.

The first bracket device 26 is arranged on the rail member 24. Preferably, the first bracket device 26 is attached on and adjacent to the first end portion 28a of the rail member 24. The first bracket device 26 includes a first supporting frame 44, a second supporting frame 46 and a bracket 48.

The first supporting frame 44 is movable relative to the rail member 24. For example, a part of the first supporting frame 44 is movably mounted in the passage 36 of the supporting rail 32. The first supporting frame 44 is movable relative to the rail member 24 through the passage 36 of the supporting rail 32, but the present invention is not limited thereto. Wherein, the first supporting frame 44 has an upper supporting wall 50a, a lower supporting wall 50b and a longitudinal wall 52 connected between the upper supporting wall 50a and the lower supporting wall 50b. A passage 54 is defined by the upper supporting wall 50a, the lower supporting wall 50b and the longitudinal wall 52. Furthermore, the first supporting frame 44 has a second limiting feature 56. The second limiting feature 56 is connected to the longitudinal wall 52 of the first supporting frame 44, and located corresponding to the first limiting feature 38 of the supporting rail 32. Hereinafter, it is illustrative of an example that the second limiting feature 56 has an extending arm with elastic force. Preferably, the first supporting frame 44 further includes an opening 58 and a first abutting feature 60 adjacent to the opening 58. Wherein, the opening 58 is formed longitudinally. Preferably, the first supporting frame 44 further includes a guiding surface 62 (e.g., an inclined surface or an arc surface). The opening 58 is located between the first abutting feature 60 and the guiding surface 62.

The second supporting frame 46 is movable relative to the first supporting frame 44. For example, a part of the second supporting frame 46 is movably mounted in the passage 54 of the first supporting frame 44. The second supporting frame 46 is movable relative to the first supporting frame 44 through the passage 54 of the first supporting frame 44, but the present invention is not limited thereto. The second supporting frame 46 includes an elastic arm 64 and a second abutting feature 66 arranged on the elastic arm 64. When the second supporting frame 46 is moved relative to the first supporting frame 44 in a predetermined moving procedure, the second abutting feature 66 is able to penetrate the opening 58 and to abut against the first abutting feature 60 of the first supporting frame 44.

The bracket 48 is arranged on the second supporting frame 46. The bracket 48 is movable relative to the second supporting frame 46. Preferably, the bracket 48 is movably mounted on the second supporting frame 46. Preferably, the bracket 48 includes a side wall 68, an end wall 70 and at least one mounting member 72. The end wall 70 is substantially perpendicularly connected to the side wall 68. The at least one mounting member 72 is arranged adjacent to the side wall 68. Hereinafter, it is illustrative of an example that two mounting members 72 penetrate the end wall 70, but the present invention is not limited thereto. Preferably, the slide rail mechanism 20 further includes a fastening member 74 movably mounted on the bracket 48.

Furthermore, a space is form in one of the bracket 48 and the second supporting frame 46. Hereinafter, it is illustrative of an example that the side wall 68 of the bracket 48 has a first wall 76a on upper part and has a second wall 76b on lower part, and a space 78 is formed between the first wall 76a and the second wall 76b. The bracket 48 is movable relative to the second supporting frame 46 through the space 78. Preferably, the fastening member 74 is pivoted with the bracket 48 through a shaft member 80. Hereinafter, it is illustrative of an example that the fastening member 74 is pivoted with the first wall 76a. Preferably, one of the bracket 48 and the second supporting frame 46 includes a limiting structure 82. The second supporting frame 46 and the bracket 48 are movable relative to each other in a limiting area through the limiting structure 82. Hereinafter, it is illustrative of an example that the limiting structure 82 is an elongated hole with boundary, and the slide rail mechanism. 20 further includes a connecting member 84 passing through a part of the limiting structure 82, in order to connect the second supporting frame 46 to the bracket 48.

As shown in FIG. 3, FIG. 4, FIG. 5 and FIG. 6, the slide rail mechanism 20 further includes a first structure 86 and a second structure 88. Wherein, the first structure 86 is able to be engaged with the second structure 88, such that the first supporting frame and the second supporting frame 46 are able to be moved simultaneously.

Preferably, the first bracket device 26 includes an elastic member 90 attached on the first supporting frame 44. Preferably, the first structure 86 is arranged on a first elastic portion 90a of the elastic member 90. In the present embodiment, the first structure 86 is at least one protruded portion or hook portion, but the present invention is not limited thereto. Preferably, the elastic member 90 is connected to a reinforcing member 92, and the elastic member 90 is connected to the first supporting frame 44 through the reinforcing member 92. The reinforcing member 92 is connected to (such as fixedly connected to) the first supporting frame 44. For example, the reinforcing member 92 can be connected to the first supporting frame 44 by riveting or welding. Preferably, the reinforcing member 92 includes at least one supporting portion. In the present embodiment, the reinforcing member 92 includes a first supporting portion 92a and a second supporting portion 92b support respectively an upper side wall 24a and a lower side wall 24b of the rail member 24. Preferably, at least one engaging portion 94 is arranged on a second elastic portion 90b of the elastic member 90. In the present embodiment, the at least one engaging portion 94 is a protruded portion or hook portion, but the present invention is not limited thereto. On the other hand, the second structure 88 is arranged on one of the second supporting frame 46 and the bracket 48. In the present embodiment, the second structure 88 is arranged on the bracket 48, and the second structure 88 has at least one wing portion, but the present invention is not limited thereto.

In other words, the first bracket device 26 is arranged on a first side (such as a back side) of the rail member 24. As shown in FIG. 5, the slide rail mechanism 20 further includes another rail member 96 (also known as a second rail) movably mounted on a second side (such as a front side) of the rail member 24. Hereinafter, the other rail member 96 is movably mounted on the rail member 24 through a middle rail 98. Therefore, a three-section slide rail assembly can be constructed of the rail member 24, the middle rail 98 and the other rail 96.

As shown in FIG. 7, FIG. 8 and FIG. 9, the slide rail mechanism 20 includes the first bracket device 26 and the second bracket device 27. Wherein, the first supporting frame 44 is retracted relative to the rail member 24 (or the supporting rail 32), and the second supporting frame 46 is retracted relative to the first supporting frame 44. Furthermore, the first supporting frame 44 and the second supporting frame 46 are engaged with each other through the first structure 86 and the second structure 88 (as shown in FIG. 8), in order to be moved simultaneously from a first position P1 along a direction D1. Wherein, when the first supporting frame 44 is retracted relative to the rail member 24, a distance is between the at least one engaging portion 94 of the elastic member 90 and the function feature 30 of the rail member 24, and a distance is between the second limiting feature 56 of first supporting frame 44 and the first limiting feature 38 of the supporting rail 32 of the rail member 24. On the other hand, when the second supporting frame 46 is retracted relative to the first supporting frame 44, a distance is between the second abutting feature 66 of the second supporting frame 46 and the first abutting feature 60 of the first supporting frame 44. In addition, the reinforcing member 92 supports the rail member 24, and the first elastic portion 90a and/or the second elastic portion 90b of elastic member 90 accumulates the elastic force.

As shown in FIG. 10, FIG. 11, FIG. 12, FIG. 13 and FIG. 14, when the first supporting frame 44 and the second supporting frame 46 are further moved simultaneously relative to the rail member 24 along the direction D1 to a second position P2. The function feature 30 is configured to disengage the first structure 86 from the second structure 88 (as shown in FIG. 14).

Specifically, when the first supporting frame 44 and the second supporting frame 46 are located at the second position P2, through the elastic member 90 being located corresponding to the function feature 30, the first elastic portion 90a and/or the second elastic portion 90b of the elastic member 90 is able to release the elastic force and be deflected by an angle (as shown in FIG. 14) to disengage the first structure 86 from the second structure 88, such that the first supporting frame 44 and the second supporting frame 46 are not moved simultaneously. Wherein, when the first supporting frame 44 is located at the second position P2 relative to the rail member 24, the elastic member 90 is deflected by the angle and be engaged with a wall 99 the function feature 30 of the rail member 24 (as shown in FIG. 14) through the engaging portion 94, in order to prevent the first supporting frame 44 from being moved along a direction opposite to the direction D1. The second limiting feature 56 of the first supporting frame 44 abuts against the first limiting feature 38 of the supporting rail 32 of the rail member 24 (as shown in FIG. 12 or FIG. 13), in order to prevent the first supporting frame 44 from being moved from the second position P2 along the direction D1.

In other words, when the first supporting frame 44 is located at the second position P2 relative to the rail member 24, the first supporting frame 44 is not able to be moved along the direction D1 or along the direction opposite to the direction D1 (as the status shown in FIG. 13). In other words, the first supporting frame 44 is able to be fixed at the second position P2.

Figure 15:
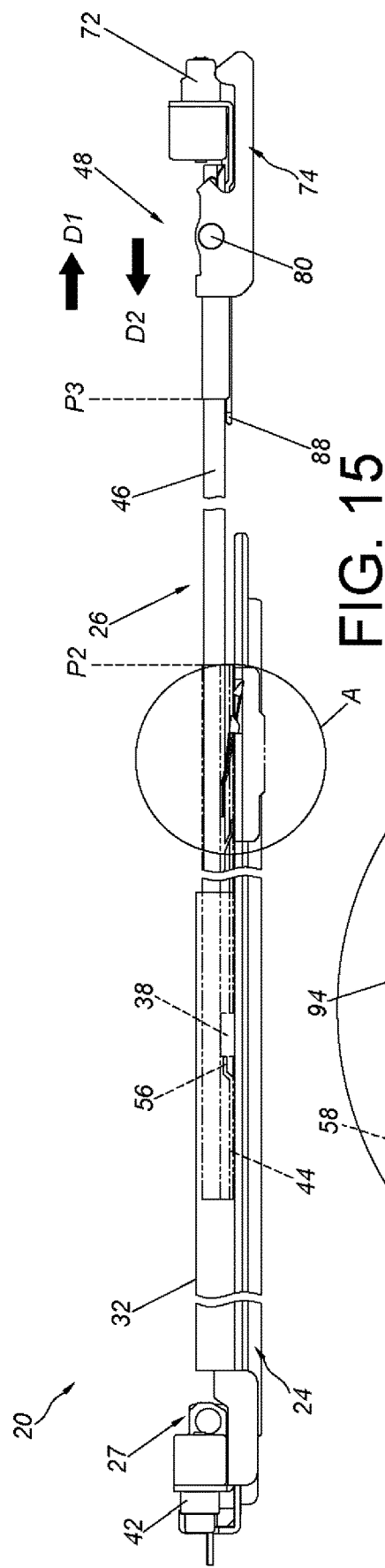
FIG. 15 is a diagram illustrating the second supporting frame of the bracket device of the slide rail mechanism is moved relative to the first supporting to another position according to the embodiment of the present invention.
Figure 16:
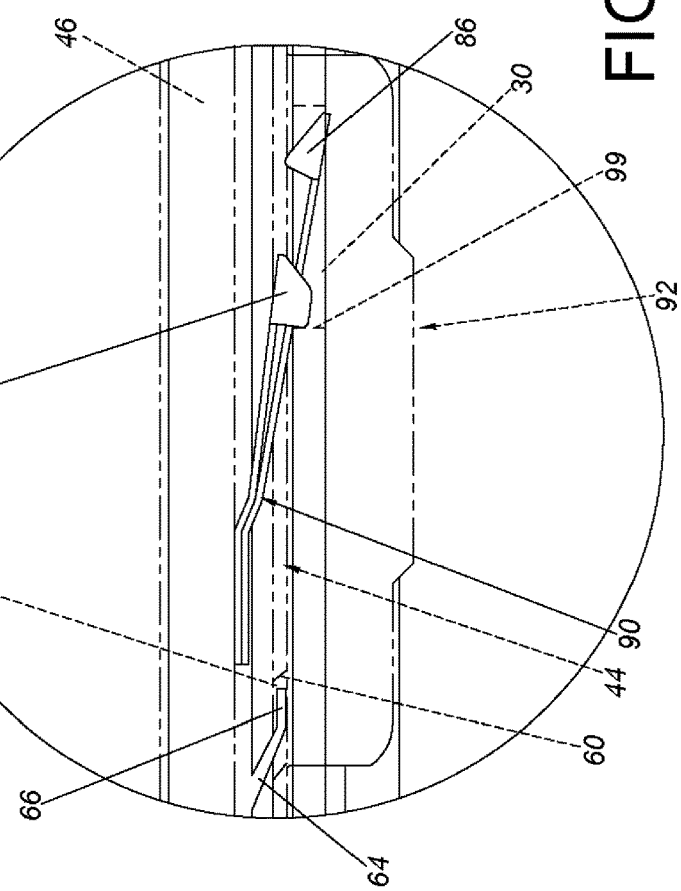
FIG. 16 is an enlarge view of an area A of FIG. 15.

As shown in FIG. 13, FIG. 15 and FIG. 16, when the first supporting frame 44 is fixed at the second position P2, the second supporting frame 46 is able to be moved along the direction D1 to a third position P3, and the second abutting feature 66 of the second supporting frame 46 abuts against the first abutting feature 60 of the first supporting frame 44, in order to prevent the second supporting frame 46 from being moved from the third position P3 along the direction D1.

As shown in FIG. 15, FIG. 17 and FIG. 18, when the second supporting frame 46 with the bracket 48 is moved from the third position P3 along a direction D2 opposite to the direction D1, through the second structure 88 abutting against the engaging portion 94 to drive the elastic member 90 to move, the engaging portion 94 is disengaged from the wall 99 of the function feature 30 of the rail member 24. In other words, the first supporting frame 44 is able to be moved relative to the rail member 24 from the second position P2 along the direction D2 to the first position P1 (as shown in FIG. 7). Preferably, one of the second structure 88 and the engaging portion 94 has a guiding feature (e.g., an inclined surface or an arc surface), in order to facilitate the second structure 88 to drive the elastic member 90 through the engaging portion 94. In the present embodiment, the second structure 88 has a first guiding feature 100a corresponding to a second guiding feature 100b arranged on the engaging portion 94, but the present invention is not limited thereto. In the present embodiment, a dimension W1 of the second structure 88 is smaller than a dimension W2 between the engaging portion 94 of the elastic member 90 and the first structure 86. Therefore, when the second structure 88 contacts the engaging portion 94 to drive the elastic member 90 to move to disengage the engaging portion 94 from the wall 99 of the function feature 30 of the rail member 24, the first structure 86 is able to be engaged with the second structure 88.

As shown in FIG. 19, the slide rail mechanism 20 can be mounted on the first post 22a and the second post 22b of the rack through the first bracket device 26 and the second bracket device 27 respectively. Wherein, the bracket 48 can be located at a first predetermined position relative to the rail member 24 through the first supporting frame 44 and the second supporting frame 46, and the reinforcing member 92 is configured to improve the structural strength of the rail member 24 to support the weight of a carried subject 102 carried by the second side (such as the front side) of the rail member 24. Wherein, when the first supporting frame 44 and the second supporting frame 46 are located at the first predetermined position, the first bracket device 26 can have a first length. Therefore, the slide rail mechanism 20 is able to be mounted on a rack with a first depth. Furthermore, the bracket 48 of the first bracket device 26 is configured to mount rail member 24 on the first post 22a of the rack. Preferably, the at least one mounting member 72 of the bracket 48 is configured to be mounted in the mounting hole of the first post 22a. In addition, the fastening member 74 can be rotated to a locking position, such that a fastening portion 74a of the fastening member 74 is able to lock the first post 22a of the rack. On the other hand, the at least one mounting member 42 of the second bracket device 27 is configured to be mounted in the mounting hole of the second post 22b. It is noticed that the fastening member 74 can also be rotated to an unlocking position, such that a fastening portion 74a of the fastening member 74 is not able to lock the first post 22a of the rack.

As shown in FIG. 20, the first supporting frame 44 and the second supporting frame 46 can be moved simultaneously relative to the rail member 24 to a second predetermined position (such as the second position P2). Wherein, the reinforcing member 92 is located at a position adjacent to the first end portion 28a of the rail member 24 and configured to improve the structural strength of a specific part of the rail member 24 (such as a rear section of the rail member 24), in order to support the weight of the carried subject 102 carried by the second side (such as the front side) of the rail member 24. Wherein, because of the moving of the first supporting frame 44 and the second supporting frame 46, the first bracket device 26 can have a second length. Therefore, the slide rail mechanism 20 is able to be mounted on a rack with a second depth.

As shown in FIG. 21, the second supporting frame 46 is movable relative to the first supporting frame 44 to a third predetermined position (such as the third position P3). Wherein, the reinforcing member 92 is located at a position adjacent to the first end portion 28a of the rail member 24 and configured to improve the structural strength of a specific part of the rail member 24 (such as a rear section of the rail member 24), in order to support the weight of the carried subject 102 carried by the second side (such as the front side) of the rail member 24. Wherein, because of the moving of the second supporting frame 46 relative to the first supporting frame 44, the first bracket device 26 can have a third length. Therefore, the slide rail mechanism 20 is able to be mounted on a rack with a third depth.

Accordingly, the embodiment of the present invention includes following features:

1. The first supporting frame 44 and the second supporting frame 46 of the first bracket device 26 are able to be moved simultaneously, such that the first supporting frame 44 and the second supporting frame 46 are able to support each other when being moved.

2. The first supporting frame 44 and the second supporting frame 46 of the first bracket device 26 are able to be moved simultaneously, such that the reinforcing member 92 is driven to move to a position adjacent to the first end portion 28a of the rail member 24. According to the above arrangement, when the carried object 102 is carried on the second side (such as the front side) of the rail member 24, the structural strength of the rail section close to the first end portion 28a of the rail member 24 can be improved, in order to prevent some specific part (e.g., the rear portion) of the carried object 102 from falling due to heavy weight. Alternatively, because of the reinforcing member 92 being moved to the position adjacent to the first end portion 28a of the rail member 24, the structural strength of the rail section close to the first end portion 28a of the rail member 24 can be improved, in order to prevent the rail section of the rail member 24 from deformation and to ensure the quality of the slide rail mechanism 20.

3. The first supporting frame 44 and the second supporting frame 46 are able to be moved simultaneously from the first position P1 along the direction D1 because of the first structure 86 and the second structure 88 being engaged with each other.

4. One of the first structure 86 and the second structure 88 is arranged on the elastic member 90.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail mechanism, comprising:
   a rail member; and
   a first bracket device arranged on the rail member, the first bracket device comprising:
      a first supporting frame movable relative to the rail member;
      a second supporting frame movable relative to the first supporting frame; and
      a bracket arranged on the second supporting frame;
   wherein the first supporting frame and the second supporting frame are able to be engaged with each other through a first structure and a second structure, in order to be moved simultaneously from a first position along a direction;
   wherein the bracket is configured to mount the rail member on a rack;
   wherein when the first supporting frame and the second supporting frame are further moved simultaneously along the direction to a second position, the first structure and the second structure are disengaged through a function feature, wherein the rail member comprises the function feature, the first bracket device comprises an elastic member, the first structure is arranged on the elastic member, when the first supporting frame and the second supporting frame are located at the second position, through the elastic member being located corresponding to the function feature, the elastic member is deflected by an angle and disengages the first structure from the second structure, such that the first supporting frame and the second supporting frame are not moved simultaneously;
   wherein the function feature comprises a wall, when the first supporting member is located at the second position, the elastic member is deflected by the angle and engaged with the wall of the function feature of the rail member through an engaging portion, in order to prevent the first supporting frame from moving along an opposite direction of the direction.

2. The slide rail mechanism of claim 1, wherein the elastic member is attached on the first supporting frame, the second structure is arranged on one of the second supporting frame and the bracket.

3. The slide rail mechanism of claim 2, wherein the elastic member is connected to the first supporting frame through a reinforcing member.

4. The slide rail mechanism of claim 3, wherein the reinforcing member comprises at least one supporting portion supporting the rail member.

5. The slide rail mechanism of claim 1, wherein the rail member comprises a limiting feature, which corresponds to another limiting feature of the first supporting frame, when the first supporting frame is located at the second position relative to the rail member, the another limiting feature of the first supporting frame abuts against the limiting feature of the supporting rail of the rail member, in order to prevent the first supporting frame from being moved from the second position along the direction.

6. The slide rail mechanism of claim 1, wherein the second supporting frame is movable relative to the first supporting frame along the direction to a third position, the first supporting frame comprises an abutting feature, which corresponds to another abutting feature of the second supporting frame, when the second supporting frame is located at the third position relative to the first supporting frame, the another abutting feature of the second supporting frame abuts against the abutting feature of the first supporting frame, in order to prevent the second supporting frame from being moved from the third position along the direction.

7. The slide rail mechanism of claim 1, wherein the bracket comprises a side wall and at least one mounting member arranged adjacent to the side wall, the at least one mounting member is configured to being mounted on the rack.

8. The slide rail mechanism of claim 1, wherein the first bracket device is arranged on a first side of the rail member.

9. The slide rail mechanism of claim 8, further comprising another rail member movably mounted on a second side of the rail member, wherein the first side and the second side of the rail member are two opposite sides.

10. The slide rail mechanism of claim 1, wherein the first bracket device is attached on and adjacent to a first end portion of the rail member, the slide rail mechanism further comprises a second bracket device attached on and adjacent to a second end portion of the rail member.

\* \* \* \* \*